United States Patent [19]

Shimatani et al.

[11] 4,438,188

[45] Mar. 20, 1984

[54] METHOD FOR PRODUCING PHOTOSENSITIVE FILM FOR ELECTROPHOTOGRAPHY

[75] Inventors: Michiro Shimatani, Fujisawa; Toyoki Kazama, Yokosuka, both of Japan

[73] Assignee: Fuji Electric Company, Ltd., Kawasaki, Japan

[21] Appl. No.: 387,221

[22] Filed: Jun. 10, 1982

[30] Foreign Application Priority Data

Jun. 15, 1981 [JP] Japan .................................. 56-91753
Sep. 24, 1981 [JP] Japan .................................. 56-150946
Sep. 24, 1981 [JP] Japan .................................. 56-150948

[51] Int. Cl.³ .......................................... G03G 5/082
[52] U.S. Cl. .................................. 430/128; 430/133; 430/136; 427/39
[58] Field of Search ...................... 430/128, 136, 133; 427/39, 74

[56] References Cited

U.S. PATENT DOCUMENTS 4,225,222 9/1980 Kempter .......................... 430/57 X
4,325,986 4/1982 Baron et al. ..................... 427/74

FOREIGN PATENT DOCUMENTS 3020815 12/1981 Fed. Rep. of Germany ........ 427/39
56-156760 12/1981 Japan ................................ 427/39

OTHER PUBLICATIONS

Res. Discl. 17354, "Silicon Device with Uniformly Thick Polysilicon", Sep. 1978, pp. 52–53.

Primary Examiner—Roland E. Martin, Jr.
Attorney, Agent, or Firm—Brumbaugh, Graves, Donohue & Raymond

[57] ABSTRACT

Disclosed are method and apparatus for producing highly uniform films of photosensitive materials (e.g., amorphous silicon) for electrophotography on large diameter cylindrical metal substrates (e.g., aluminum or stainless steel) by plasma chemical vapor deposition (CVD). The cylindrical substrate is rotatably mounted in a reaction chamber and serves as an electrode. A hollow metallic second electrode in the reaction chamber coaxially surrounds the substrate and is spaced apart therefrom. Hydrogen gas is first introduced into the inter-electrode space between the substrate and the second electrodes, and a high-frequency electric field is applied to the two electrodes to generate a glow discharge for plasma cleaning of the substrate surface. The hydrogen gas is then pumped out of the reaction chamber, and a reaction gas of monosilane ($SiH_4$) is then flowed through the inter-electrode space and a glow discharge is again generated between the electrodes to decompose the silane and to cause amorphous silicon to deposit on the surface of the substrate. During deposition both the substrate and the second electrode are electrically heated. The reaction gas is introduced and exhausted in a manner such that reaction gas density in the inter-electrode space is uniform along the axial direction.

9 Claims, 11 Drawing Figures

4,438,188

METHOD FOR PRODUCING PHOTOSENSITIVE FILM FOR ELECTROPHOTOGRAPHY

BACKGROUND OF THE INVENTION

This invention relates to a method and apparatus for producing a photosensitive layer, used for photosensitive films for electrophotography, on a cylindrical conductive substrate by using plasma CVD techniques.

Photosensitive layers, used for photosensitive films for electrophotography employed as electrostatic copiers, printers for computers, etc., have been produced by using, for example, evaporation of selenium, or selenium alloys, coatings of resins containing cadmium sulfide and zinc oxide, or coatings of organic photoconductive materials. However, photosensitive films for electrophotography having a photosensitive layer composed of, for example, an amorphous silicon (hereinafter given by a-Si) having high surface hardness and good heat resisting property have recently attracted as photosensitive materials with long life and high reliability. The photosensitive layers of a-Si have been produced by plasma CVD techniques. The production of such a photosensitive layer has been carried out, for example, by arranging a cylindrical conductive substrate, coaxially supported by a rotatable support, in a reaction chamber, introducing a reaction gas, composed mainly of, for example, monosilane (SiH$_4$), into the reaction chamber after vacuum exhausting it, keeping the reaction chamber at a desired vacuum degree, heating the cylindrical substrate to a desired temperature, and decomposing the reaction gas by applying a high frequency voltage between the cylindrical substrate and a cylindrical electrode oppositely arranged around the substrate so as to generate a glow discharge therein, thereby depositing a-Si layer on the structure (Referring to T. Kawamura, M. Nakano, et al, Papers of the General Meeting of the Inst. of Electronics and Communication Engineers of Japan, March 1980, pp 2-269-270). Although the photosensitive films for electrophotography have been practically required for large surface area, it is difficult to deposit uniform photosensitive layer on the cylindrical substrate having considerably large diameter and length in order to obtain uniform image or picture thereon.

SUMMARY OF THE INVENTION

It is an object of the present invention to provide a method and apparatus for producing a photosensitive layer having uniform thickness and good photosensitive properties on the entire surface of a cylindrical substrate.

The object can be accomplished by previously cleaning a surface of a cylindrical conductive substrate, and supplying or exhausting a reaction gas to or from a space between the substrate and a cylindrical electrode coaxially opposed to the substrate so as to uniformly disperse the reaction gas in at least an axial direction of the substrate when a photosensitive layer is produced on the substrate by generating a glow discharge in the space between the cylindrical substrate, coaxially supported by a rotatable support arranged in a reaction chamber, and the cylindrical electrode to decompose the reaction introduced thereinto.

The present invention depends upon such a recognition that a uniform photosensitive layer is not obtained when contaminations are present at the substrate surface and that when the supply or exhaust of the reaction gas is not dispersed, the film thickness and the photosensitive properties of the photosensitive film are not made uniform because the hydrogen concentration in the reaction gas is gradually increased as the reaction gas moves away from the supply port to decrease monotonously the deposition rate of the photosensitive layer toward the outlet port from the inlet port.

In order to clean a substrate surface, known methods, such as a method for cleaning the substrate outside a reaction chamber by using a solvent such as trichloroethylene, etc., or a method for carrying out plasma etching by generating a glow discharge in an argon atmosphere within a vacuum exhausted reaction chamber by applying DC voltage thereto, can be employed. However, there is a fear that the substrate is not sufficiently cleaned by using only the trichloroethylene. It is difficult to plasma etch the substrate having large area such as photosensitive film for electrophotography because the discharge is centered at the local space when DC glow discharge is used. In addition, when high frequency glow discharge is generated in an argon gas atmosphere, the opposing electrode and the wall of the reaction chamber are sputtered by the plasma to contaminate the surface of the substrate. In order to eliminate the disadvantage, it is effective that the substrate surface is plasma etched by generating the glow discharge by means of the high frequency electric field after hydrogen is introduced into the vacuum reaction chamber containing the substrate.

In order to carry out the supply and exhaust of the reaction gas by uniformly dispersing it in an axial direction, it is desirable to form through-holes, which are uniformly dispersed in at least the axial direction, to the opposing electrode. It is advisable that the reaction gas is supplied to space between the substrate and the opposing electrode from both sides of the axial direction when it is exhausted through the through-holes. It is also desirable that the reaction gas is supplied toward the substrate surface from a direction perpendicular to the substrate axis when it is supplied through the through-holes. This obstructs that the photosensitive layer is provided with a structure grown in parallel with the axial direction of the substrate. When the photosensitive film, which was composed of the photosensitive layer having the structure grown in parallel with the axial direction of the structure, for example, was applied to a copying test of a great number of sheets and a heat cycle test, cracks 2 were generated at the surface of the photosensitive film 1 along the longitudinal direction as shown in FIG. 1(A). In addition, when a heat resisting test for heating the photosensitive film in a vacuum chamber to 300° C. was carried out, a-Si layer on the photosensitive film 1 was separated leaving hatched portions 3 shown in FIG. 1(B). The present invention depends upon such a recognition that the growth of the structure of photosensitive layer in the axial direction is suppressed because the reaction gas does not become a stratiform flow flowing through the substrate surface in the axial direction when it is supplied from the direction perpendicular to the substrate axis. Further, in order to exhaust the reaction gas in a direction perpendicular to the substrate axis, it is effective that the reaction gas is allowed to flow in one direction therethrough by dividing a cylindrical electrode into two pieces, connecting through-holes of one portion to a reaction gas supply and connecting through-holes of the other to an exhaust system.

It is desirable that both a rotatable support for supporting the substrate within the reaction chamber and an axis of the opposing electrode are approximately vertical. This is effective in the plasma CVD techniques in order to prevent the production of the photosensitive layer having irregularities by not depositing on the electrode having lower temperature than the substrate to produce the photosensitive layer in general, and dropping and depositing a decomposed material, deposited as powder, for example, silicon powder containing hydrogen, on the surface of the photosensitive layer. It is more effective that the deposited material is not made a powdery structure but a layer-shaped structure by heating the opposing electrode. The heating temperature is more than 100 C. when a-Si layer is produced.

DETAILED DESCRIPTION

Embodiments of the present invention will be described with the accompanying drawings and examples.

Figure 1A:
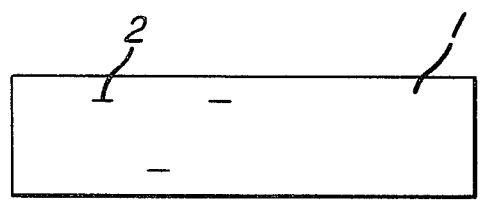
FIG. 1(A) is a plan view showing a condition of cracks generated by testing a conventional photosensitive film by copying and heat cycle tests.
Figure 1B:
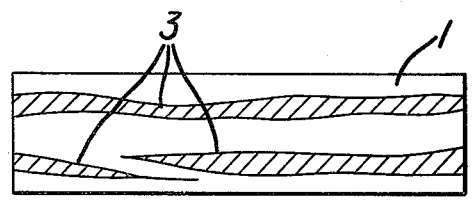
FIG. 1(B) is a plan view showing a condition of peeling generated by testing a conventional photosensitive film by heat resisting acceleration test.
Figure 2:
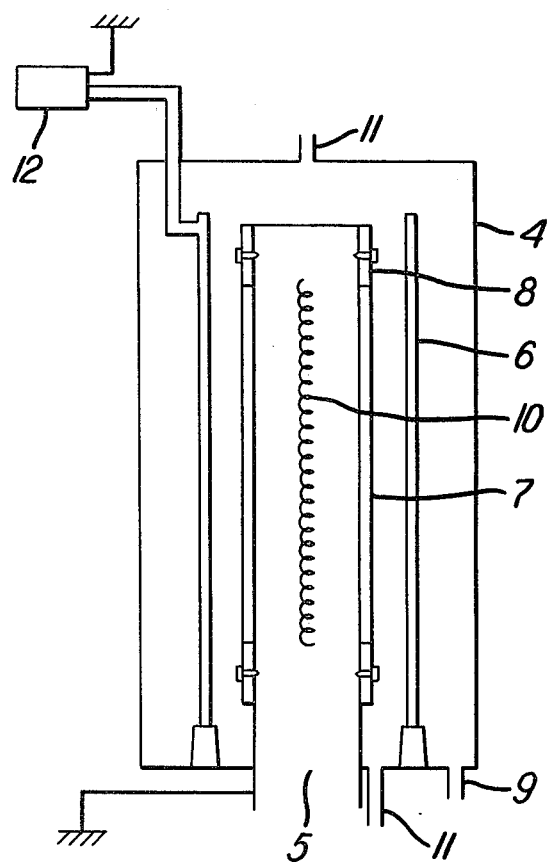
FIG. 2 is a cross-sectional view showing an apparatus for producing a photosensitive film for electrophotography according to one embodiment of the present invention.

In FIG. 2, a rotatable support 5 and a cylindrical opposing electrode 6 are vertically and coaxially arranged in a reaction chamber 4 to be evacuated. The opposing electrode 6 is provided with uniformly dispersed and arranged slits 61 or through-holes 62 as shown by expanded drawings of FIGS. 3(A) and (B). Using the apparatus, a cylindrical substrate (drum) 7, which is rinsed by trichloroethylene and made of aluminum or stainless steel, is held by a support 8, and attached to the rotatable support 5. The reaction chamber 4 is evacuated from an exhaust port 9 to keep it at $10^{-5}$ Torr. The drum 7 is kept at a desired temperature by a heater 10 fixed in the support, and a hydrogen gas is introduced into the reaction chamber through either gas supply ports 11 formed at upper and lower portions thereof. A high frequency input is applied to the opposing electrode 6 from a high frequency power source 12 to generate a glow discharge between the opposing electrode 6 and the drum 7 kept at a ground potential, thereby cleaning the surface of the drum. On the contrary, the high frequency input can be applied to the drum 7 while keeping the electrode 6 at the ground potential. After $H_2$ gas is exhausted from the reaction chamber, $SiH_4$ gas is introduced into the reaction chamber through the gas supply ports of both sides to generate similarly the glow discharge. The reaction gas reached the space between the electrode 6 and the drum 7 is then decomposed to deposit a-Si layer on the rotatable drum 7. The composition of the reaction gas contacted to the surface of the drum is approximately uniform since the reaction gas is dispersed and exhausted through the slits 61 or through-holes 62, thereby providing uniform photosensitive layer on the entire surface of the drum. Until the reaction gas reaches the center portion of the drum 7 from the supply ports 11, the hydrogen concentration is slightly increased to lower the deposition rate. However, the flow rate of the reaction gas is faster at the region near the supply ports 11 than the far region, and the deposition rate is lowered for this reason. Therefore, uniform film thickness can be obtained since both are compensated. The deposited a-Si layer can be made P-type, i-type, or N-type by adding an impurity gas having desired concentration and desired kind to the reaction gas at the same time, or adding no impurity gas. Further, a photosensitive layer with a junction such as P-i, P-N, N-i, etc can be produced by changing the kind of the impurity or by adding no impurity gas to the reaction gas after the discharge is stopped to exhaust the gas.

EXAMPLE 1

Figure 3A:
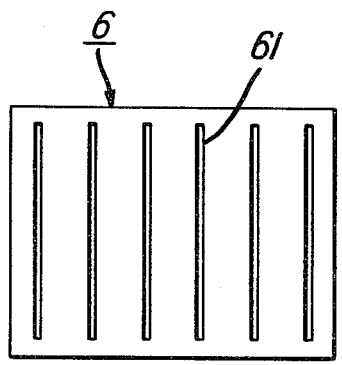
FIGS. 3(A) and (B) are expanded views showing two examples of electrodes.

Using the apparatus shown in FIG. 2 provided with the electrode 6 with 6 slits 61 as shown in FIG. 3(A), the aluminum drum having the diameter of 90 mm and the length of 320 mm was heated to 200° C., and the glow discharge was generated in a hydrogen atmosphere at 4 Torr at a flow rate of 300 cc/min by the high frequency input of 10 W to clean the drum surface. Thereafter, 100% $SiH_4$ gas and diborane ($B_2H_6$) gas having the concentration of 30 PPM in hydrogen were introduced into the reaction chamber at the flow rate of 50 cc/min and 6 cc/min, respectively. The high frequency input of 50 W was applied to the electrode in a gas pressure of 0.9 Torr to produce P-type a-Si layer by the glow discharge for 5 hours. By way of comparison using an apparatus that a cylindrical opposing electrode without slits and an axis of a rotatable support were horizontally arranged and that a reaction gas was introduced thereinto from one end of a drum and exhausted from the other, a-Si layer was deposited on the drum under the same condition as described above. Table 1 shows the thickness of produced a-Si layers, wherein in samples according to the present invention positions A, B and C signify the upper edge, the center and the lower edge of the drum, respectively, and in the comparison samples positions A, B and C signify the edge of the drum at the gas supply side, the center of the drum and the edge of the drum at the gas exhaust side, respectively.

TABLE 1

| Gas Supply Port | Electrode | Thickness of a-Si Layer | | |
|---|---|---|---|---|
| | | A | B | C |
| Both side | With slits | 18.0 | 17.5 | 18.0 |
| One side | Without slits | 22.4 | 18.6 | 14.2 |

That is, uniform film thickness was obtained when the electrode according to the present invention was used, while the film thickness was monotonously decreased from the gas supply side to the gas exhaust side when the conventional electrode was employed. On the contrary, since the axes of the drum and the electrodes are vertical in the apparatus shown in FIG. 2, Si(H) powder will not drop on the side if it drops from the electrode. Accordingly, the powder can not be deposited on the surface of the deposited layer on the drum.

EXAMPLE 2

Figure 3B:
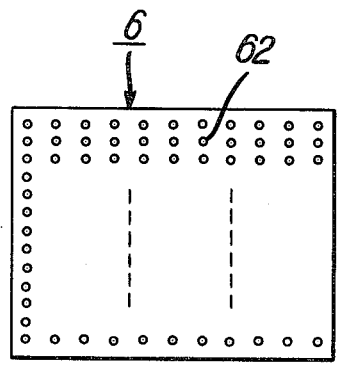

Using the apparatus shown in FIG. 2 provided with the opposing electrode with a great number of through-holes 62 as shown in FIG. 3(B), uniform film thickness was obtained when a-Si layer was produced in the same manner as Example 1.

Figure 4:
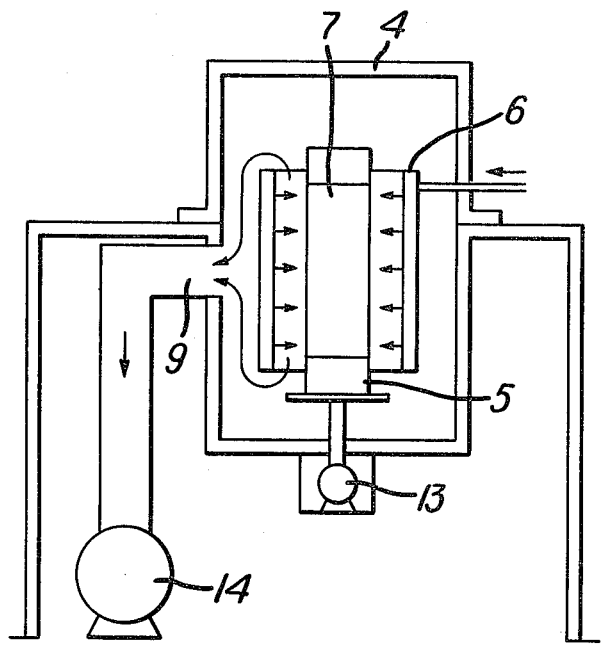
FIG. 4 is a cross-sectional view of a manufacturing apparatus according to another embodiment of the present invention.

In a capacitance coupling type plasma CVD apparatus shown in FIG. 4, the reaction gas passes through the interior of the opposing electrode 6 having the double wall structure, and is centripetally supplied from the through-holes toward the surface of the drum 7 which is held by the support 5 driven by a motor 13 and then exhausted by a vacuum pump 14 through an exhaust port 9 from upper and lower sides of the electrode. According to the apparatus, since the reaction gas does not become a stratiform flow flowing through the substrate surface in the axial direction, the growth of the structure of photosensitive layer in the axial direction is suppressed and cracks are not generated in a-Si layer by the stress, which is applied to a-Si layer at right angles with respect to the axial direction when copying or printing is carried out. In addition, the uniformity of the reaction gas contacting to the surface of the drum is further increased as compared with that of the apparatus shown in FIG. 2, thereby providing the uniform thickness of the photosensitive layer and good photosensitive properties. Slits as shown in FIG. 3(A) may be formed in the inner wall of the electrode instead of through-holes.

Figure 5A:
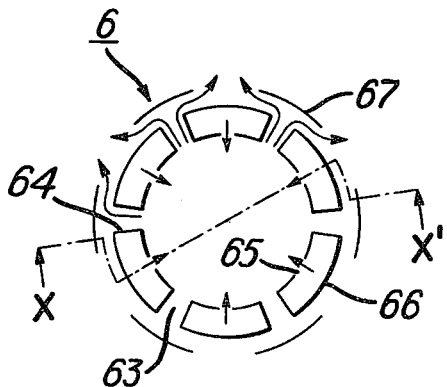
FIG. 5(A) is a cross-sectional view of an opposing electrode in further example of the present invention.
Figure 5B:
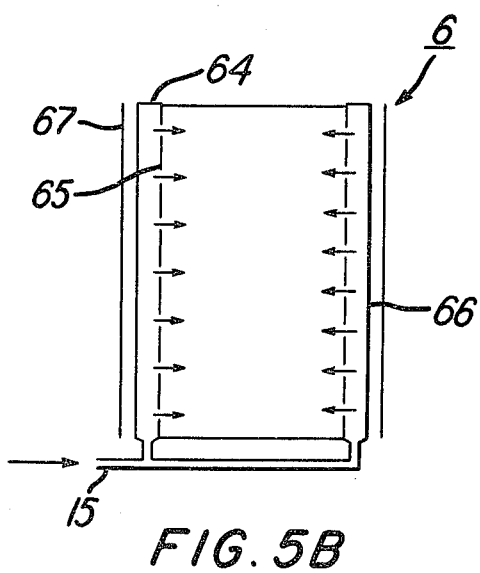
FIG. 5(B) is a vertical-sectional view taken at the X—X' line in FIG. 5(A)

FIG. 5 shows another opposing electrode for centripetally supplying the reaction gas, and FIG. 5(B) is a cross-sectional view of x—x' line in FIG. 5(A). The electrode 6 has a double wall structure in the same manner as FIG. 4, and is divided into 6 fan-shaped cylindrical portions 64 by longitudinal slits 63. The reaction gas flows through the interior of the cylindrical portions 64 from a supply pipe 15 and fluxes toward the drum from through-holes 65 formed in the inner wall so as to be per perpendicular to the drum surface. The reacted gas passes through the slits 63 and is exhausted through a space between an outer wall 66 of the cylindrical portions 64 and a shield plate 67 for confining the plasma. Since the flow of the reaction gas is perpendicular to the axis of the substrate until the reaction gas introduced into the reaction space and is exhausted therefrom if such opposing electrode is employed, the structure of a-Si is grown along the periphery of the drum, but the generation of cracks is not caused by the structure of a-Si because the structure of a-Si layer is a direction in parallel with the stress which is applied when the copying or printing is carried out. The uniformity of the film thickness and photosensitive properties is also improved.

Figure 6A:
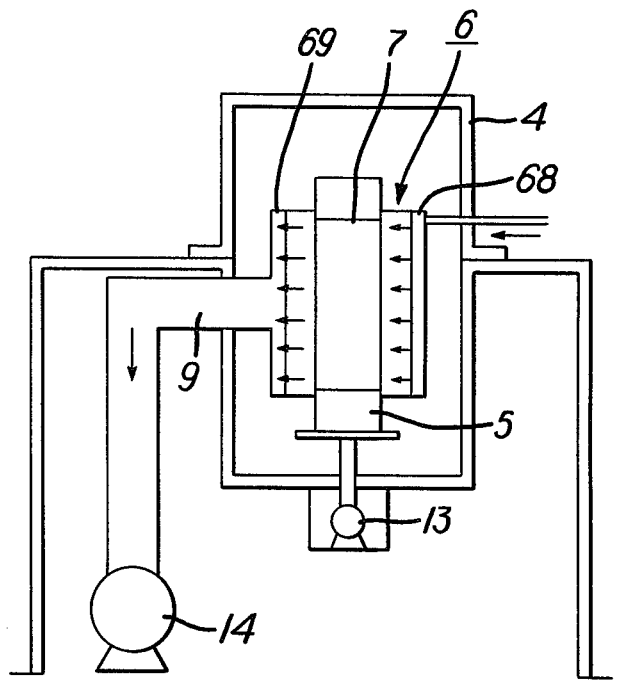
FIG. 6(A) is a cross-sectional view of a manufacturing apparatus according to further embodiment of the present invention.
Figure 6B:
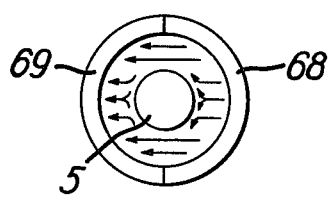
FIG. 6(B) is an expanded view of the opposing electrode of the apparatus of FIG. 6(A)

FIGS. 6(A)(B) show similarly a plasma CVD apparatus which realize the flow of the reaction gas perpendicular to the substrate axis until the reaction gas is introduced into the reaction space and exhausted therefrom. The opposing electrode 6 coaxially arranged to the rotatable support 5 within the reaction chamber 4 is similarly provided with the double structure, but is comprised of semicircular cylinders 68, 69 divided by a plane passing through the center axis. The reaction gas is emitted from one semicircular electrode 68 and enters the other electrode 69, and is then exhausted through an exhaust port 9. Since the reaction gas flows in parallel toward the electrode 69 from the electrode 68 as shown in FIG. 6(B), it is vertically contacted to the surface of the drum 7 in the center of the flow, and flows at both ends in the direction of tangent line with respect to the surface of the drum 7. Therefore, a difference is observed with respect to the deposition state of a-Si layer, but a-Si photosensitive layer is made uniform because the substrate is rotated. It is not required due to the similar reason that the through-holes, through which the reaction gas flows, are formed over the entire surface of the opposing electrode. The opposing electrode may be locally provided with the through-holes of only one or a few rows in a cross section perpendicular to the axis if the through-holes are uniformly distributed in the axial direction of the substrate.

EXAMPLE 3

Using the apparatus shown in FIG. 2, an aluminum drum 7, which had been rinsed by trichloroethylene and had the diameter of 90 mm and the length of 320 mm, was arranged on the support 5 and heated to 200° C. by the heater 10. The high frequency input of 10 W was applied to the electrode 6 from the power source 12, while introducing the hydrogen gas into the reaction chamber at the gas pressure of 4 Torr at the flow rate of 300 cc/min from either supply port 11 by exhausting it from the exhaust port 9. The glow discharge was then generated for 10 minutes between the electrode 6 and the drum kept at the ground potential, thereby cleaning the surface of the drum by the plasma etching. While a gas composed of 100% $SiH_4$ at a gas pressure of 0.7 Torr and $B_2H_6$ gas having the concentration of 30 ppm and containing hydrogen were introduced into the reaction chamber from both supply ports 11 at the flow rate of 60 cc/min and 8 cc/min, respectively, the high frequency input of 15 W was applied to the electrode 6 from the high frequency power source 12 to continue the glow discharge for 20 hours, thereby depositing p-type a-Si layer on the surface of the drum 7. The a-Si layer thus produced had good surface with lower irregularities. By way of comparison, using a drum rinsed by only trichloroethylene, a glow discharge was generated in an argon atmosphere by DC voltage to plasma etch the surface of the drum, and a-Si layer was produced under the same condition as described above. When a tensile rod with a desired cross-sectional area adhered to the surface of a-Si layer formed on the drum and was then drawn at a force of 1 $Kg/mm^2$ with respect to the area of a-Si layer bonded to the rod, the number of samples of a-Si layers separated from the drums were given by Table 2 with respect to 50 samples.

TABLE 2

| Cleaning Method | Number Of Separated Samples |
| --- | --- |
| Trichloroethylene Rinse | 30 |
| Ar DC Plasma Etching | 16 |
| $H_2$ High Frequency Plasma Etching | 0 |

It will be apparent that the cleaning method according to the present invention is remarkably excellent.

Figure 7:
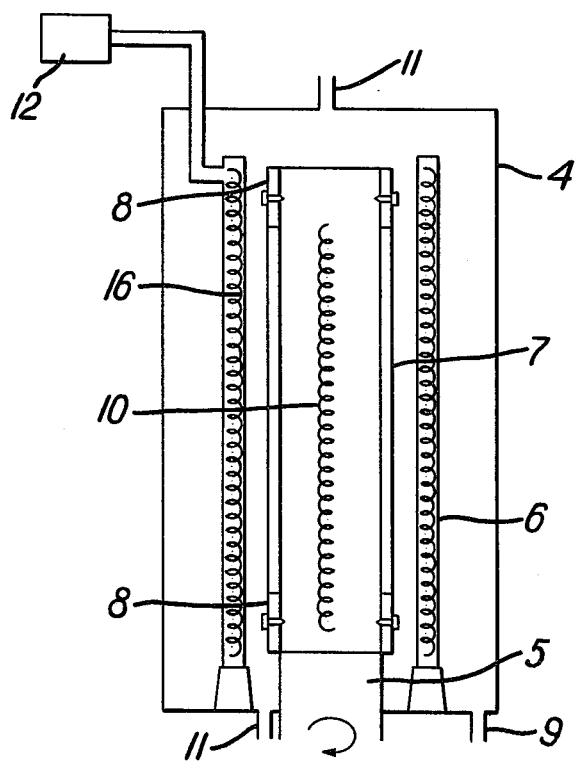
FIG. 7 is a cross-sectional view of a manufacturing apparatus according to a still further embodiment of the present invention.

A different point of an apparatus shown in FIG. 7 from the apparatus shown in FIG. 2 is that a cylindrical opposing electrode 6 is provided with a heater 16 in its interior at positions at which through-holes are not provided. When the opposing electrode is heated by the heater 16, high density a-Si layer is produced on the surface thereof by the decomposition of SiH₄ gas, and the surface of the photosensitive layer on the drum 7 is not contaminated because the powdery material is not deposited. Further, although the powdery material is apt to be deposited on the inner wall of the reaction chamber, it is prevented that the powdery material falls on the surface of the photosensitive layer because the axis of the support 5 is vertical. More further, when the opposing electrode is heated by the heater, the drum may be heated by the radiated heat at the same time. In this case, the opposing electrode is heated to higher temperature than the drum. Therefore, it is not necessary to provide the heater 10 to the rotatable support 5. Accordingly, the difficulty of the electrical connections between the heater in the rotatable support and the stationary portion can be avoided.

EXAMPLE 4

Using the apparatus shown in FIG. 7 a-Si layer was deposited on the surface of the drum 7 under the same condition as that of Example 3 except that the temperature of the opposing electrode 6 was kept by the heater 16 at 250° C. and 150° C., respectively. A powdery material was not deposited on the opposing electrode at either temperatures, and the obtained photosensitive layer had good surface without lower irregularities.

The production of a-Si layer used for the photosensitive film was explained as described above, but the present invention will not be limited to it and applicable to a production of zinc oxide photosensitive layer, etc.

We claim:

1. In a method of producing a photosensitive film on a substrate surface including generating a glow discharge in a space between a cylindrical conductive substrate coaxially supported by a rotatable support arranged in a reaction chamber and a cylindrical electrode coaxially opposed to the surface of said cylindrical conductive substrate to decompose a reaction gas introduced into said reaction chamber, said method comprising previously cleaning said surface of said substrate, and supplying or exhausting said reaction gas to or from said space between said substrate and said electrode so as to be uniformly dispersed in an axial direction of at least said substrate.

2. A method of producing a photosensitive film for electrophotography according to claim 1, wherein said substrate is arranged in said reaction chamber and hydrogen is introduced into said reaction chamber to generate the glow discharge by means of a high frequency electric field, thereby cleaning said substrate surface by resulting plasma etching.

3. A method of producing a photosensitive film for electrophotography according to claim 2, wherein said reaction gas is supplied to said space between said substrate and said electrode from both sides of said axial direction, and is exhausted in a vertical direction with respect to said axial direction.

4. A method of producing a photosensitive film for electrophotography according to claim 1, wherein said reaction gas is fed from a direction perpendicular to a substrate axis to said substrate surface.

5. A method of producing a photosensitive film for electrophotography according to claim 4, wherein said reaction gas is exhausted from both sides of an axial direction of said space between said substrate and said electrode.

6. A method of producing a photosensitive film for electrophotography according to claim 4, wherein said reaction gas is exhausted in a direction perpendicular to said substrate axis.

7. A method of producing a photosensitive film for electrophotography accoding to claim 1, wherein said electrode is heated when said reaction gas is decomposed.

8. A method for producing a photosensitive film for electrophotography according to claim 1, wherein said reaction gas is composed mainly of a silicon compound, and a photosensitive layer is formed of an amorphous silicon layer.

9. A method of producing a photosensitive film for electrophotography according to claim 7, wherein said electrode is heated to above 100° C.

* * * * *